(12) United States Patent
Yao (10) Patent No.: US 10,115,748 B2
(45) Date of Patent: Oct. 30, 2018

(54) THIN FILM TRANSISTOR ARRAY SUBSTRATE AND MANUFACTURE METHOD OF THIN FILM TRANSISTOR ARRAY SUBSTRATE

(71) Applicant: Shenzhen China Star Optoelectronics Technology Co., Ltd., Shenzhen, Guangdong (CN)

(72) Inventor: Jiangbo Yao, Guangdong (CN)

(73) Assignee: Shenzhen China Star Optoelectronics Co., Ltd, Shenzhen, Guangdong (CN)

( * ) Notice: Subject to any disclaimer, the term of this patent is extended or adjusted under 35 U.S.C. 154(b) by 131 days.

(21) Appl. No.: 15/033,624

(22) PCT Filed: Feb. 18, 2016

(86) PCT No.: PCT/CN2016/074066
§ 371 (c)(1),
(2) Date: Apr. 29, 2016

(87) PCT Pub. No.: WO2017/124594
PCT Pub. Date: Jul. 27, 2017

(65) Prior Publication Data
US 2018/0047765 A1    Feb. 15, 2018

(30) Foreign Application Priority Data
Jan. 22, 2016  (CN) .......................... 2016 1 0046347

(51) Int. Cl.
*H01L 21/00* (2006.01)
*H01L 27/12* (2006.01)
(Continued)

(52) U.S. Cl.
CPC ........ *H01L 27/1288* (2013.01); *H01L 27/127* (2013.01); *H01L 27/1225* (2013.01);
(Continued)

(58) Field of Classification Search
CPC . H01L 27/3262; H01L 51/56; H01L 51/0023; H01L 27/1225; H01L 2227/323;
(Continued)

(56) References Cited

U.S. PATENT DOCUMENTS 6,091,465 A    7/2000  Lyu
9,590,111 B2 *  3/2017  Yamazaki ........... H01L 29/7869
(Continued)

FOREIGN PATENT DOCUMENTS

CN    102194893 A    9/2011
CN    103050410 A    4/2013
(Continued)

*Primary Examiner* — Thinh T Nguyen
(74) *Attorney, Agent, or Firm* — Andrew C. Cheng (57) ABSTRACT

Provided are a thin film transistor array substrate and a manufacture method thereof, comprising: providing a substrate, and the substrate comprises a first surface and a second surface, which are oppositely located; forming a gate on the first surface; forming a first insulative layer, which covers on the gate; forming a metal oxide semiconductor layer on the first insulative layer; implementing ion implantation to two end regions of the metal oxide semiconductor layer, and the two end regions after the ion implantation respectively are a source and a drain, and a region without the ion implantation is an active layer; forming a second insulative layer, which covers the source, the drain and the active layer; opening a via exposing the source or the drain in the second insulative layer; forming a pixel electrode on the second insulative layer, and connected with the source or the drain through the via.

2 Claims, 7 Drawing Sheets

(51) Int. Cl.
  *H01L 29/24* (2006.01)
  *H01L 29/786* (2006.01)
  *H01L 29/22* (2006.01)
  *G02F 1/1362* (2006.01)
  *G02F 1/1368* (2006.01)
  *H01L 27/32* (2006.01)

(52) U.S. Cl.
  CPC .............. *H01L 29/22* (2013.01); *H01L 29/24* (2013.01); *H01L 29/7869* (2013.01); *G02F 1/1368* (2013.01); *G02F 1/136227* (2013.01); *H01L 27/1214* (2013.01); *H01L 27/3262* (2013.01)

(58) Field of Classification Search
  CPC . H01L 27/1214; H01L 51/5206; H01L 21/77; H01L 27/12; H01L 27/1288
  USPC ..... 257/43, 59, 72, E21.7, E29.001; 438/85, 438/86, 104, 48, 128
  See application file for complete search history.

(56) References Cited

U.S. PATENT DOCUMENTS

| | | | |
|---|---|---|---|
| 2004/0023432 A1* | 2/2004 | Haga | C03C 17/3417 438/104 |
| 2009/0315026 A1* | 12/2009 | Jeong | H01L 29/45 257/43 |
| 2012/0097951 A1* | 4/2012 | Kang | H01L 27/3223 257/59 |
| 2013/0077012 A1* | 3/2013 | Tada | H01L 29/66765 349/43 |
| 2013/0277666 A1* | 10/2013 | Choi, II | H01L 27/1225 257/43 |
| 2015/0069378 A1 | 3/2015 | Cha et al. | |
| 2015/0348996 A1* | 12/2015 | Qin | H01L 27/1214 257/43 |
| 2015/0372259 A1* | 12/2015 | Kim | H01L 27/1262 438/99 |
| 2016/0293504 A1* | 10/2016 | Cho | H01L 22/32 |
| 2017/0229529 A1* | 8/2017 | Jung | H01L 27/3258 |

FOREIGN PATENT DOCUMENTS

| | | |
|---|---|---|
| CN | 103915508 A | 7/2014 |
| CN | 104124277 A | 10/2014 |
| CN | 104779139 A | 7/2015 |
| CN | 105097841 A | 11/2015 |
| CN | 105140271 A | 12/2015 |
| JP | H08264794 A | 10/1996 |

* cited by examiner

THIN FILM TRANSISTOR ARRAY SUBSTRATE AND MANUFACTURE METHOD OF THIN FILM TRANSISTOR ARRAY SUBSTRATE

CROSS REFERENCE

This application claims the priority of Chinese Patent Application No. 201610046347.9, entitled "Thin film transistor array substrate and manufacture method of thin film transistor array substrate", filed on Jan. 22, 2016, the disclosure of which is incorporated herein by reference in its entirety.

FIELD OF THE INVENTION

The present invention relates to a display skill field, and more particularly to a thin film transistor array substrate and a manufacture method of a thin film transistor array substrate.

BACKGROUND OF THE INVENTION

In the liquid crystal display field, the Thin Film Transistor Array substrate comprises a plurality of Thin Film Transistors (TFTs) which are distributed in array. The thin film transistor is generally employed to the switch component to control the operation of the pixel electrode, or employed to be the drive component for driving the pixel. Generally, a protective layer covers on the active layer of the thin film transistor in the thin film transistor array substrate. The objective is to protect the active layer from damage as etching for the source and the gate. In the thin film transistor of such structure, the etch stopper layer needs to be patterned in general. Thus, one mask process is added for patterning the etch stopper layer. Then, the manufacture time of the thin film transistor array substrate is increased.

SUMMARY OF THE INVENTION

The present invention provides a thin film transistor array substrate, and the thin film transistor array substrate comprises:

a substrate, and the substrate comprises a first surface and a second surface, which are oppositely located;

a gate, located on the first surface;

a first insulative layer, covering on the gate;

an active layer, located on a surface of the first insulative layer away from the substrate;

a source and a drain, and the source and the drain are respectively located on the first insulative layer, and respectively located at two opposite ends of the active layer, and the source and the drain respectively contact end surfaces of the active layer;

a second insulative layer, and the second insulative layer covers the active layer, the source and the drain, and a via employed for exposing the source or the drain is located in the second insulative layer;

a pixel electrode, and the pixel electrode is located on the second insulative layer, and contacts with the source or the drain through the via.

The thin film transistor array substrate further comprises: the second insulative layer comprises a first via and a second via, and the first via is located corresponding to the source, and the second via is located corresponding to the drain, and the pixel electrode is connected with the drain through the second via;

the thin film transistor array substrate further comprises a first electrode, and the first electrode is connected with the source through the first via.

The first electrode and the pixel electrode are manufactured in the same process.

The active layer comprises metal oxide semiconductor; the source and the drain comprise metal oxide semiconductor after ion implantation.

The active layer comprises one or an arbitrary combination of Indium Gallium Zinc Oxide, Indium Tin Oxide, Indium Oxide and Zinc Oxide.

The present invention further provides a manufacture method of a thin film transistor array substrate, wherein the manufacture method of the thin film transistor array substrate comprises:

providing a substrate, and the substrate comprises a first surface and a second surface, which are oppositely located;

forming a gate, and the gate is located on the first surface;

forming a first insulative layer, and the first insulative layer covers on the gate;

forming a metal oxide semiconductor layer on the first insulative layer;

implementing ion implantation to two end regions of the metal oxide semiconductor layer, and the two end regions of the metal oxide semiconductor layer after the ion implantation respectively are a source and a drain, and a region of the metal oxide semiconductor layer without the ion implantation is an active layer;

forming a second insulative layer, and the second insulative layer covers the source, the drain and the active layer;

opening a via employed to expose the source or the drain in the second insulative layer;

forming a pixel electrode, and the pixel electrode is located on the second insulative layer, and is connected with the source or the drain through the via.

The step of opening a via employed to expose the source or the drain in the second insulative layer comprises:

opening a first via and a second via in the second insulative layer, and the first via is located corresponding to the source, and the second via is located corresponding to the drain;

correspondingly, the step of forming a pixel electrode, and the pixel electrode is located on the second insulative layer, and is connected with the source or the drain through the via comprises:

forming a pixel electrode, and the pixel electrode is located on the second insulative layer, and the pixel electrode is connected with the drain through the second via;

the manufacture method of the thin film transistor array substrate further comprises:

forming a first electrode, and the first electrode is connected with the source through the first via.

The step of implementing ion implantation to two end regions of the metal oxide semiconductor layer, and the two end regions of the metal oxide semiconductor layer after the ion implantation respectively are a source and a drain, and a region of the metal oxide semiconductor layer without the ion implantation is an active layer comprises:

covering the metal oxide semiconductor layer with a first photoresist layer;

patterning the first photoresist layer to expose the two end regions of the metal oxide semiconductor layer;

employing the patterned first photoresist layer as a mask to implement the ion implantation to the metal oxide semiconductor layer, and the two end regions of the metal oxide semiconductor layer after the ion implantation respectively are the source and the drain, and the region of the metal oxide semiconductor layer without the ion implantation is the active layer;

stripping the first photoresist layer.

The step of opening a first via and a second via in the second insulative layer, and the first via is located corresponding to the source, and the second via is located corresponding to the drain comprises:

covering the second insulative layer with a second photoresist layer;

patterning the second photoresist layer to remove the second photoresist layer correspondingly right above the source and the drain to expose a portion of the second photoresist layer;

employing the patterned second photoresist layer as a mask to etch the second photoresist layer to open the first via and the second via in the second insulative layer;

stripping the second photoresist layer.

the pixel electrode and the first electrode are manufactured in the same process:

forming a transparent conductive layer, and the transparent conductive layer covers the second insulative layer, the source and the drain;

patterning the transparent conductive layer to preserve the transparent conductive layer located on the source and the drain, and a transparent conductive layer connected with the transparent conductive layer located on the drain, wherein the transparent conductive layer located on the source is the first electrode, and the transparent conductive layer located on the drain is the pixel electrode.

In comparison with prior art, the manufacture method of the thin film transistor array substrate according to the present invention forms the metal oxide semiconductor layer on the first insulative layer (gate isolation layer), and implements ion implantation to the two end regions of the metal oxide semiconductor layer. The two end regions of the metal oxide semiconductor layer after the ion implantation respectively forms the source and the drain, and the region of the metal oxide semiconductor layer without the ion implantation is the active layer. Accordingly, the formation of the source and the drain and the formation of the active layer can be in the same manufacture process without the additional stopper layer patterning process as manufacturing the source and the drain. Thus, the manufacture time of the thin film transistor array substrate can be saved.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained, should be considered within the scope of protection of the present invention.

Figure 1:
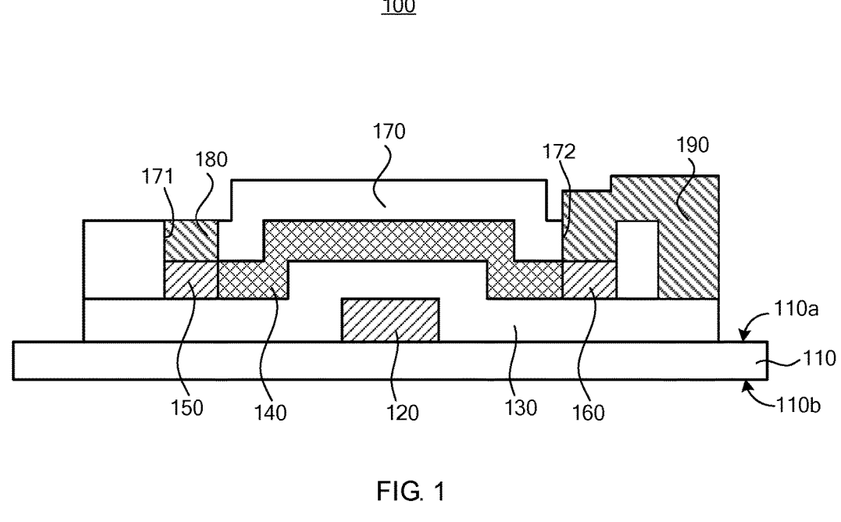
FIG. 1 is a sectional structure diagram of a thin film transistor array substrate according to the preferred embodiment of the present invention.

Please refer to FIG. 1. FIG. 1 is a sectional structure diagram of a thin film transistor array substrate according to the preferred embodiment of the present invention. The thin film transistor array substrate 100 comprises a substrate 110, a gate 120, a first insulative layer 130, an active layer 140, a source 150, a drain 160, a second insulative layer 170 and a pixel electrode 190. The substrate 110 comprises a first surface 110a and a second surface 110b, which are oppositely located. The gate 120 is located on the first surface 110a, and the first insulative layer 130 covers on the gate 120. The active layer 140 is located on a surface of the first insulative layer 130 away from the substrate 110. The source 150 and the drain 160 are respectively located on the first insulative layer 130, and respectively located at two opposite ends of the active layer 140, and the source 150 and the drain 160 respectively contact end surfaces of the active layer 140. The source 150 and the drain 160 are at the same layer with the active layer 140. The second insulative layer 170 covers the active layer 140, the source 150 and the drain 160, and a via employed for exposing the source 150 or the drain 160 is located in the second insulative layer 170. The pixel electrode 190 is located on the second insulative layer 170, and is connected with the source 150 or the drain 160 through the via.

Specifically, the second insulative layer 170 comprises a first via 171 and a second via 172, and the first via 171 is located corresponding to the source 150, and the second via 172 is located corresponding to the drain 160. The pixel electrode 190 is connected with the drain 160 through the second via 172. The thin film transistor array substrate 100 further comprises a first electrode 180, and the first electrode 180 is connected with the source 150 through the first via 171. The first electrode 180 is employed to improve the conductive performance of the source 150. Preferably, the first electrode 180 and the pixel electrode 190 are manufactured in the same process.

The substrate 110 can be a glass substrate, and also can be a plastic substrate or other insulative substrate.

It is understood that in this embodiment, it is illustrated for explanation that other components (i.e. the gate 120, the first insulative layer 130, the active layer, the source 150, the drain 160, the second insulative layer 170, the first electrode 180 and the pixel electrode 190) of the thin film transistor array substrate 100 except the substrate 110 are directly or indirectly located on the first surface 110a of the substrate 110. In other embodiments, the other components of the thin film transistor array substrate 100 except the substrate 110 also can be directly or indirectly located on the second surface 110b of the substrate 110.

In other embodiments, the thin film transistor array substrate 100 further comprises a buffer layer (not shown), and the buffer layer is located on the first surface 110a. The buffer layer is employed to buffer the stress in the processes of manufacturing other structures of the thin film transistor array substrate 100 on the substrate 110 to prevent the damage or fracture of the substrate 110. Then, the gate 120, the first insulative layer 130, the active layer 140, the source 150, the drain 160, the second insulative layer 170, the first electrode 180 and the pixel electrode 190 in the thin film transistor array substrate 100 are directly or indirectly located on the first surface 110a of the substrate 110 through the buffer layer. Alternatively, the buffer layer is located on the second surface 110b, and the gate 120, the first insulative layer 130, the active layer 140, the source 150, the drain 160, the second insulative layer 170, the first electrode 180a and the pixel electrode 190 in the thin film transistor array substrate 100 are directly or indirectly located on the second surface 110b of the substrate 110 through the buffer layer. Material of the buffer layer is selected from one of a silicon oxide layer, a silicon nitride layer, a silicon oxynitride layer and a combination thereof.

The gate 120 is located on the first surface 110a, and material of the gate 120 is metal or metal alloy. In one embodiment, the material of the gate is selected from one of copper, tungsten, chromium, aluminum and a combination thereof.

The first insulative layer 130 is a gate isolation layer, and material of the first insulative layer 130 is selected from one of a silicon oxide layer, a silicon nitride layer, a silicon oxynitride layer and a combination thereof.

Material of the second insulative layer 170 is selected from one of a silicon oxide layer, a silicon nitride layer, a silicon oxynitride layer and a combination thereof. It is understood that materials of the second insulative layer 170 and the first insulative layer 130 can be the same and can be different.

In this embodiment, the active layer 140 comprises metal oxide semiconductor. In one embodiment, the active layer 140 comprises one or an arbitrary combination of Indium Gallium Zinc Oxide (IGZO), Indium Tin Oxide, Indium Oxide and Zinc Oxide. Preferably, the source 150 and the drain 160 comprise metal oxide semiconductor after ion implantation. The source 150, the drain 160 and the active layer 140 are at the same layer. In one embodiment, the ion implantation can be Hydrogen ion implantation. The ion implantation to the metal oxide semiconductor layer can make the region implemented with the ion implantation possess the property of metal conduction. Besides, because the conductivity uniformity of the source 150 and the drain 160 obtained by implementing ion implantation to the metal oxide semiconductor layer is poor, forming the first electrode 180 corresponding to the source 150 and forming the pixel electrode 190 corresponding to the drain 160 can promote the conductive performances of the source 150 and the drain 160.

Figure 2:
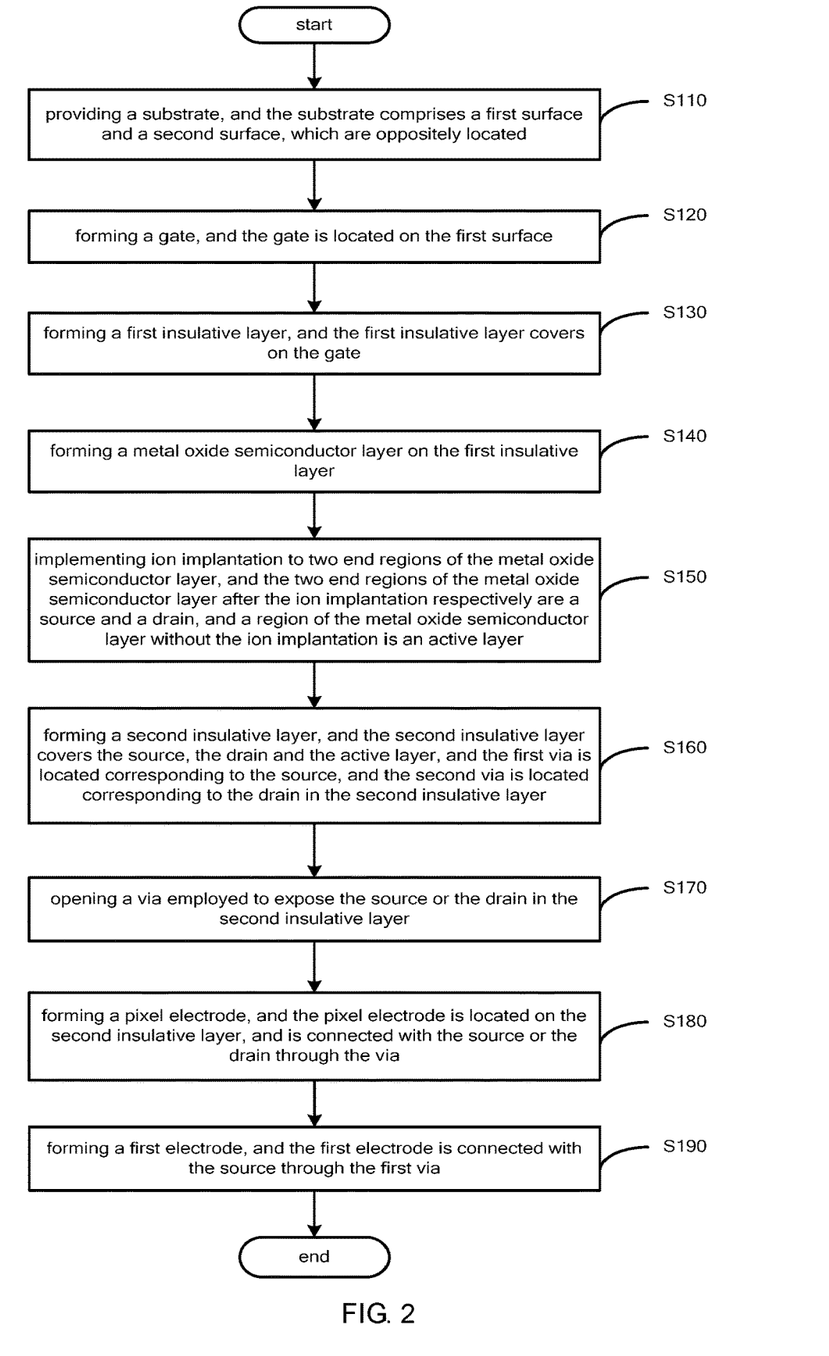
FIG. 2 is a flowchart of a manufacture method of a thin film transistor array substrate according to the preferred embodiment of the present invention.
Figure 3:
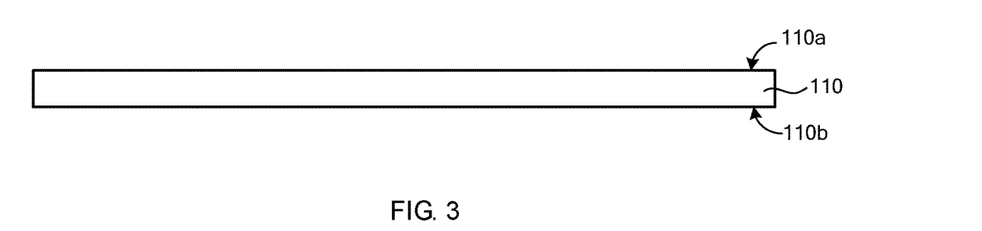
FIG. 3 to FIG. 17 are structure diagrams corresponding to respective steps of the manufacture method of the thin film transistor array substrate.
Figure 4:
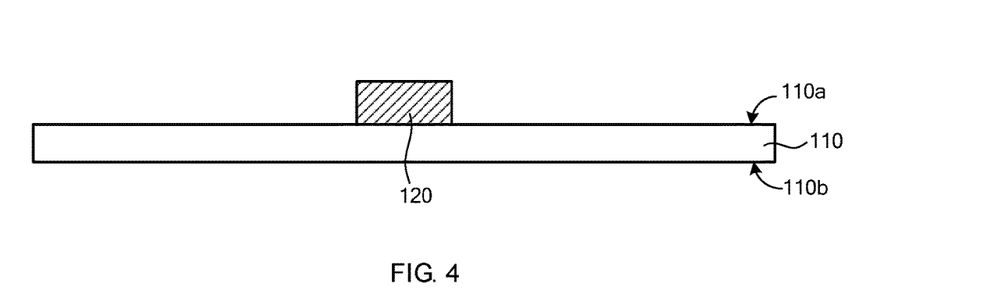
Figure 5:
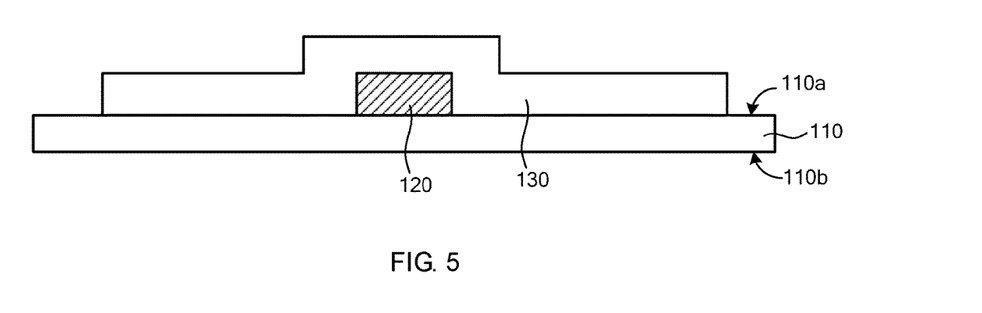
Figure 6:
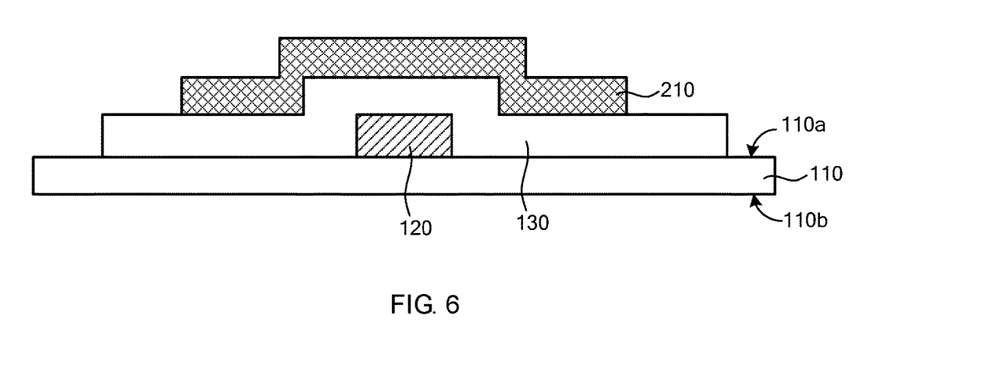

With combination of FIG. 1 and the forgoing related description of the thin film transistor array substrate, the manufacture method of a thin film transistor array substrate according to the present invention is described below. Please refer to FIG. 2. FIG. 2 is a flowchart of a manufacture method of a thin film transistor array substrate according to the preferred embodiment of the present invention. The manufacture method of the thin film transistor array substrate comprises steps of:

Step S110, providing a substrate 110, and the substrate 110 comprises a first surface 110a and a second surface 110b, which are oppositely located. Please refer to FIG. 3. The substrate 110 can be a glass substrate, a plastic substrate or other insulative substrate but not restricted thereto.

step S120, forming a gate 120, and the gate 120 is located on the first surface 110a. Please refer to FIG. 4. The gate 120 can be formed with the following steps. First, forming an entire layer of metal on the first surface 110a of the substrate 110, and then, patterning the entire layer of metal to form the gate 120 located on the first surface 110a in this embodiment.

step S130, forming a first insulative layer 130, and the first insulative layer 130 covers on the gate 120. Please refer to FIG. 5.

step S140, forming a metal oxide semiconductor layer 210 on the first insulative layer 130. Please refer to FIG. 6.

step S150, implementing ion implantation to two end regions of the metal oxide semiconductor layer 210, and the two end regions of the metal oxide semiconductor layer 210 after the ion implantation respectively are a source 150 and a drain 160, and a region of the metal oxide semiconductor layer without the ion implantation is an active layer 140. The ion implantation to the metal oxide semiconductor layer 210 can make the region implemented with the ion implantation possess the property of metal conduction. The ion implantation can be Hydrogen ion implantation.

Figure 7:
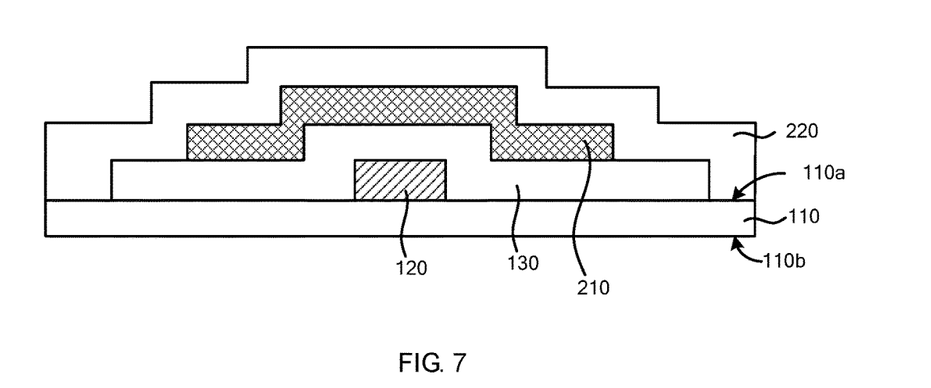
Figure 8:
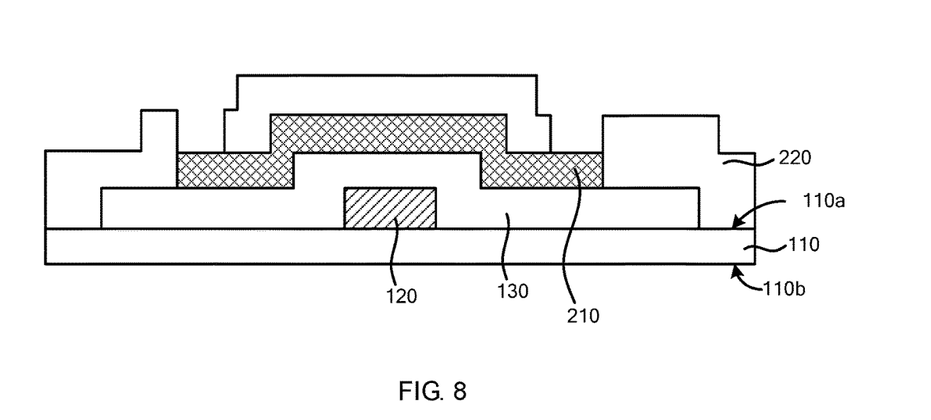
Figure 9:
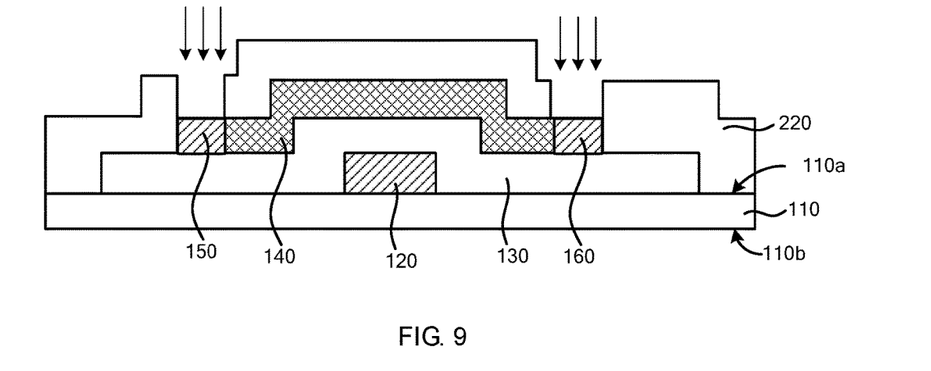
Figure 10:
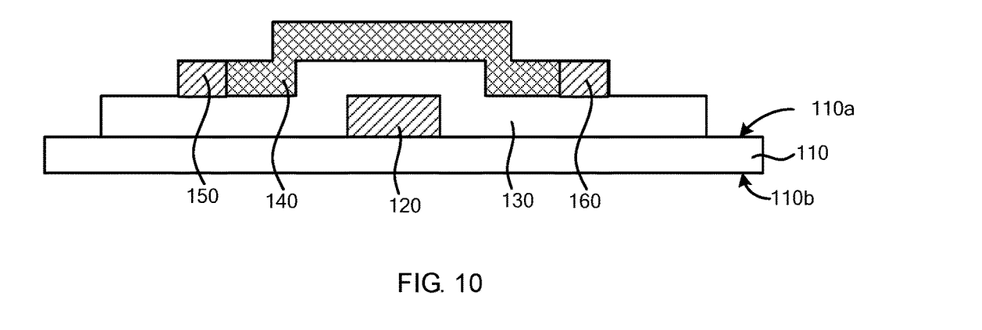
Figure 11:
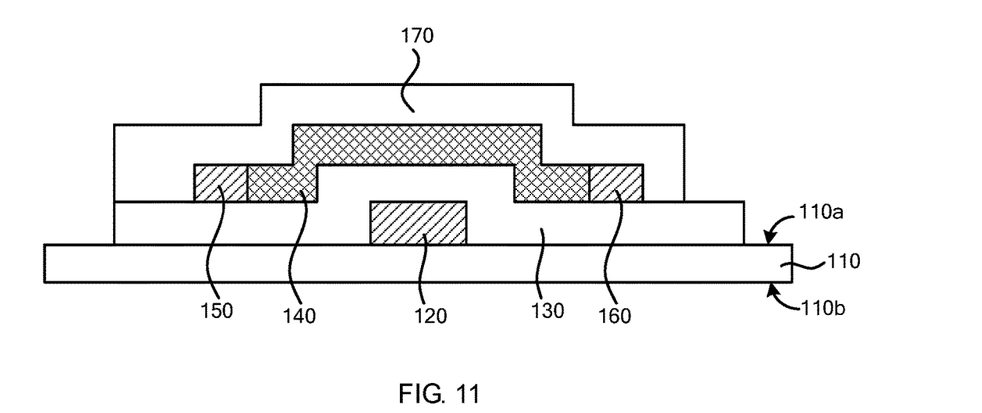

Specifically, the step S150 comprises steps of:

step S151, covering the metal oxide semiconductor layer 210 with a first photoresist layer 220. Please refer to FIG. 7.

step S152, patterning the first photoresist layer 220 to expose the two end regions of the metal oxide semiconductor layer 210. Please refer to FIG. 8.

step S153, employing the patterned first photoresist layer 210 as a mask to implement the ion implantation to the metal oxide semiconductor layer 210 (indicated with the arrows in FIG. 9), and the two end regions of the metal oxide semiconductor layer 210 after the ion implantation respectively are the source 150 and the drain 160, and the region of the metal oxide semiconductor layer 210 without the ion implantation is the active layer 140. Please refer to FIG. 9.

step S154, stripping the first photoresist layer 220. Please refer to FIG. 10.

step 160, forming a second insulative layer 170, and the second insulative layer 170 covers the source 150, the drain 160 and the active layer 140. Please refer to FIG. 11.

step 170, opening a via employed to expose the source 150 or the drain 160 in the second insulative layer 170.

Specifically, the step S170 comprises: step S171, opening a first via 171 and a second via 172 in the second insulative layer 170, and the first via 171 is located corresponding to the source 150, and the second via 172 is located corresponding to the drain 160.

Figure 12:
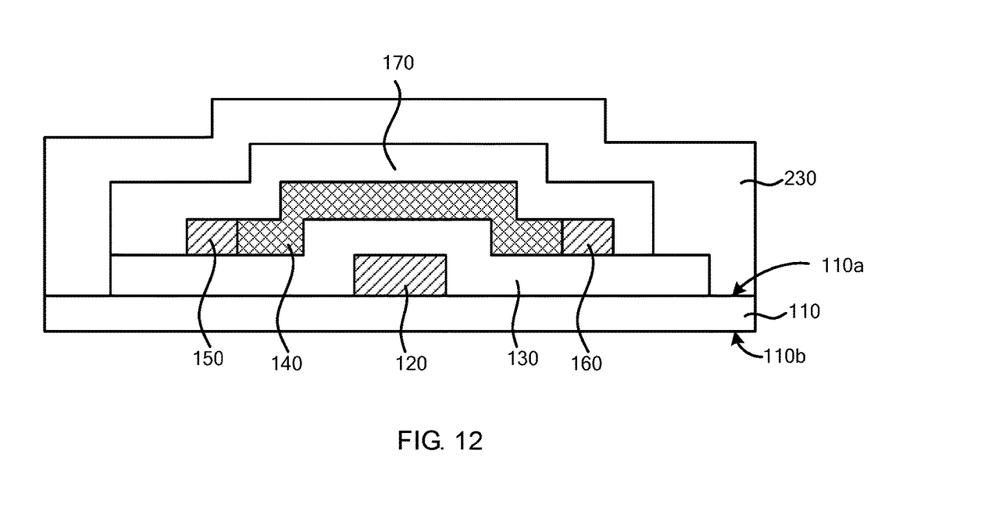
Figure 13:
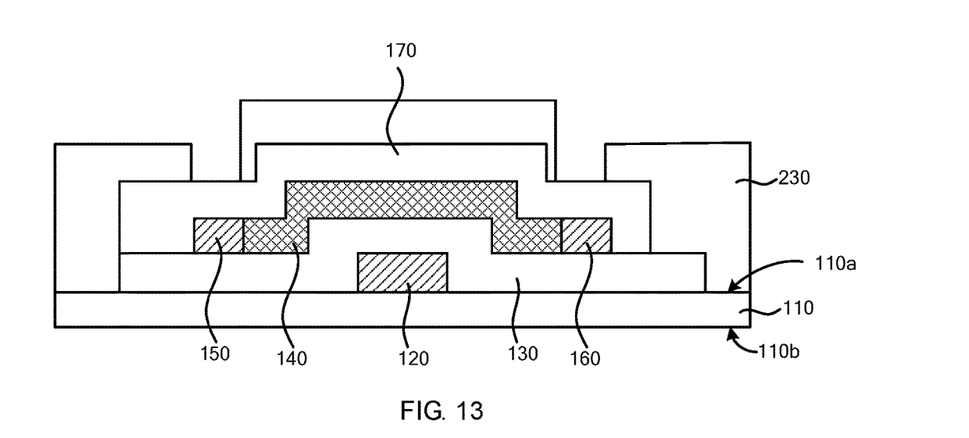
Figure 14:
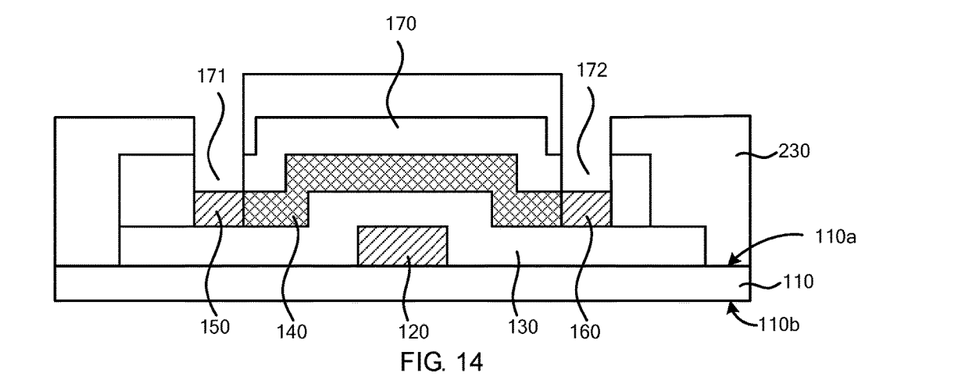
Figure 15:
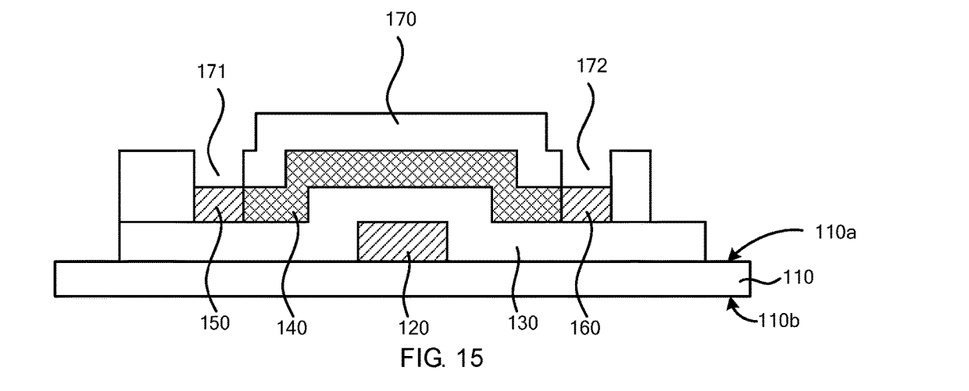

The step S171 specifically comprises the following steps.

step S171a, covering the second insulative layer 170 with a second photoresist layer 230. Please refer to FIG. 12.

step S171b, patterning the second photoresist layer 230 to remove the second photoresist layer 230 correspondingly right above the source 150 and the drain 160 to expose a portion of the second photoresist layer 170. Please refer to FIG. 13.

step S171c, employing the patterned second photoresist layer 230 as a mask to etch the second photoresist layer 170 to open the first via 171 and the second via 172 in the second insulative layer 170. Please refer to FIG. 14.

step S171d, stripping the second photoresist layer 230. Please refer to FIG. 15.

step S180, forming a pixel electrode 190, and the pixel electrode 190 is located on the second insulative layer 170, and is connected with the source 150 or the drain 160 through the via.

Corresponding to the step S171, the step S180 comprises: step S181, forming a pixel electrode 190, and the pixel electrode 190 is located on the second insulative layer 170, and the pixel electrode 190 is connected with the drain 160 through the second via 172.

Correspondingly, the manufacture method of the thin film transistor array substrate further comprises:

step S190, forming a first electrode 180, and the first electrode 180 is connected with the source 150 through the first via 171.

Figure 16:
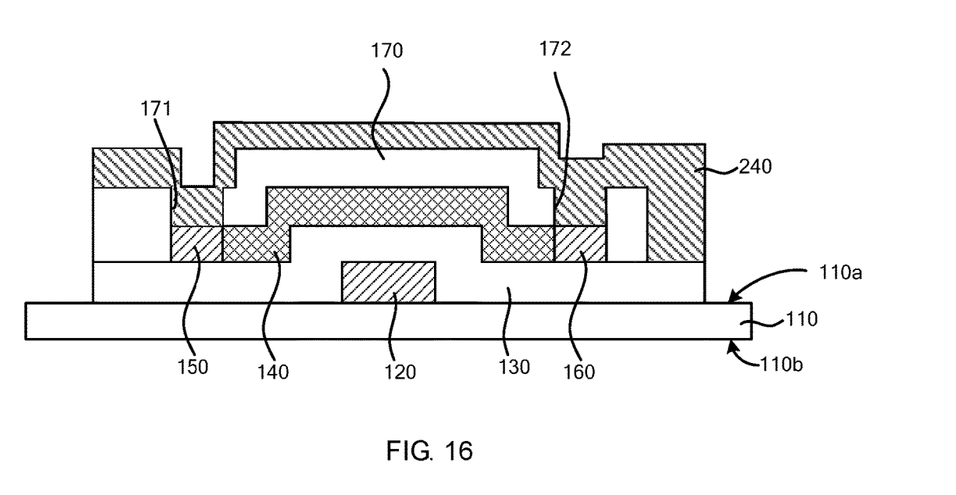
Figure 17:
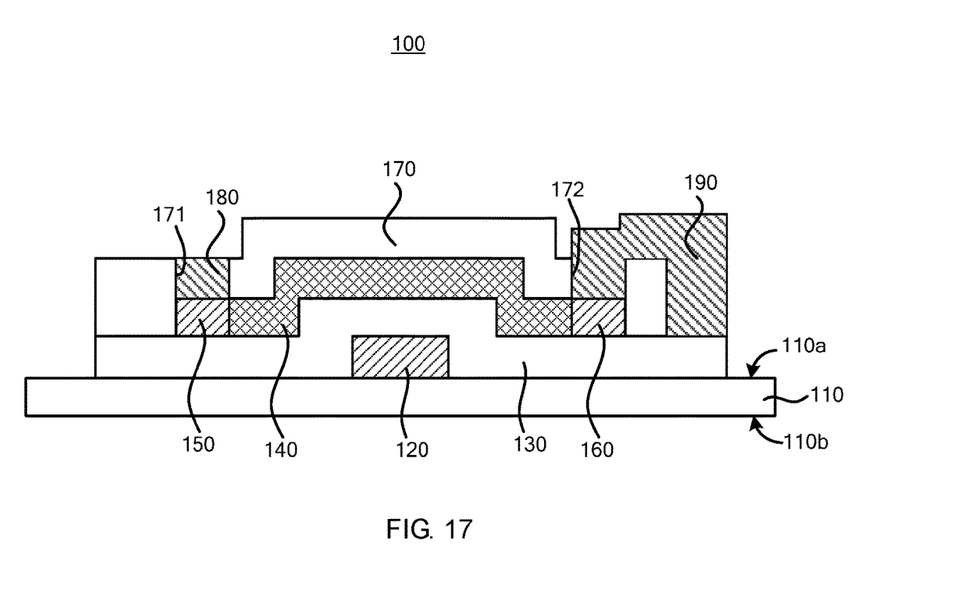

Preferably, the pixel electrode 190 and the first electrode 180 are manufactured in the same process. In other words, the step S180 and the step S190 can be the same process. Specifically, manufacturing the pixel electrode 190 and the first electrode 180 comprises steps of:

step a, forming a transparent conductive layer 240, and the transparent conductive layer 240 covers the second insulative layer 170, the source 150 and the drain 160. Please refer to FIG. 16. The transparent conductive material comprises one or an arbitrary combination of Indium Gallium Zinc Oxide, Indium Tin Oxide, Indium Oxide and Zinc Oxide.

step b, patterning the transparent conductive layer 240 to preserve the transparent conductive layer 240 located on the source 150 and the drain 160, and a transparent conductive layer connected with the transparent conductive layer located on the drain 160, wherein the transparent conductive layer 240 located on the source 150 and connected with the source 150 is the first electrode 180, and the transparent conductive layer 240 located on the drain 160 is the pixel electrode 190. Please refer to FIG. 17.

In other embodiments, the manufacture method of the thin film transistor array substrate 100 further comprises forming a buffer layer, and the buffer layer is located on the first surface 110a of the substrate 110. The buffer layer is employed to buffer the stress in the processes of manufacturing other structures of the thin film transistor array substrate 100 on the substrate 110 to prevent the damage or fracture of the substrate 110. Then, the gate 120, the first insulative layer 130, the active layer 140, the source 150, the drain 160, the second insulative layer 170, the first electrode 180 and the pixel electrode 190 in the manufacture method of the thin film transistor array substrate 100 are directly or indirectly manufactured on the first surface 110a of the substrate 110 through the buffer layer. Alternatively, the buffer layer is located on the second surface 110b, and the gate 120, the first insulative layer 130, the active layer, the source 150, the drain 160, the second insulative layer 170, the first electrode 180 and the pixel electrode 190 in the thin film transistor array substrate 100 are directly or indirectly located on the second surface 110b of the substrate 110 through the buffer layer. Material of the buffer layer is selected from one of a silicon oxide layer, a silicon nitride layer, a silicon oxynitride layer and a combination thereof.

In the embodiment provided by the present invention, the pixel electrode is connected to the drain through the second via, and the first electrode is connected to the source through the first via. However, it can be understood that the pixel electrode also can be connected to the source through the first via, and the first electrode can be connected to the drain through the second via to improve the conductive performance of the drain. The structure and the manufacture method is similar with the embodiment of the present application. The repeated description is omitted here.

In comparison with prior art, the manufacture method of the thin film transistor array substrate according to the present invention forms the metal oxide semiconductor layer 210 on the first insulative layer 130 (gate isolation layer), and implements ion implantation to the two end regions of the metal oxide semiconductor layer 210. The two end regions of the metal oxide semiconductor layer 210 after the ion implantation respectively forms the source 150 and the drain 160, and the region of the metal oxide semiconductor layer 210 without the ion implantation is the active layer 140. Accordingly, the formation of the source 150 and the drain 160 and the formation of the active layer 140 can be in the same manufacture process without the additional stopper layer patterning process as manufacturing the source 150 and the drain 160. Thus, the manufacture time of the thin film transistor array substrate can be saved.

Above are embodiments of the present invention, which does not limit the scope of the present invention. Any modifications, equivalent replacements or improvements within the spirit and principles of the embodiment described above should be covered by the protected scope of the invention.

What is claimed is:

1. A manufacture method of a thin film transistor array substrate, wherein the manufacture method of the thin film transistor array substrate comprises:

providing a substrate, and the substrate comprises a first surface and a second surface, which are oppositely located;

forming a gate, and the gate is located on the first surface;

forming a first insulative layer, and the first insulative layer covers on the gate;

forming a metal oxide semiconductor layer on the first insulative layer;

implementing ion implantation to two end regions of the metal oxide semiconductor layer, and the two end regions of the metal oxide semiconductor layer after the ion implantation respectively are a source and a drain, and a region of the metal oxide semiconductor layer without the ion implantation is an active layer;

forming a second insulative layer, and the second insulative layer covers the source, the drain and the active layer;

opening a via employed to expose the source or the drain in the second insulative layer;

forming a pixel electrode, and the pixel electrode is located on the second insulative layer, and is connected with the source or the drain through the via;

wherein the step of opening a via employed to expose the source or the drain in the second insulative layer comprises:

opening a first via and a second via in the second insulative layer, and the first via is located corresponding to the source, and the second via is located corresponding to the drain;

correspondingly, the step of forming a pixel electrode, and the pixel electrode is located on the second insulative layer, and is connected with the source or the drain through the via comprises:

forming a pixel electrode, and the pixel electrode is located on the second insulative layer, and the pixel electrode is connected with the drain through the second via;

the manufacture method of the thin film transistor array substrate further comprises:

forming a first electrode, and the first electrode is connected with the source through the first via;

wherein the step of opening a first via and a second via in the second insulative layer, and the first via is located corresponding to the source, and the second via is located corresponding to the drain comprises:

covering the second insulative layer with a second photoresist layer;

patterning the second photoresist layer to remove the second photoresist layer correspondingly right above the source and the drain to expose a portion of the second photoresist layer;

employing the patterned second photoresist layer as a mask to etch the second photoresist layer to open the first via and the second via in the second insulative layer;

stripping the second photoresist layer; and wherein the pixel electrode and the first electrode are manufactured in the same process:

forming a transparent conductive layer, and the transparent conductive layer covers the second insulative layer, the source and the drain;

patterning the transparent conductive layer to preserve the transparent conductive layer located on the source and the drain, and a transparent conductive layer connected with the transparent conductive layer located on the drain, wherein the transparent conductive layer located on the source is the first electrode, and the transparent conductive layer located on the drain is the pixel electrode.

2. The manufacture method of the thin film transistor array substrate according to claim 1, wherein the step of implementing ion implantation to two end regions of the metal oxide semiconductor layer, and the two end regions of the metal oxide semiconductor layer after the ion implantation respectively are a source and a drain, and a region of the metal oxide semiconductor layer without the ion implantation is an active layer comprises:

covering the metal oxide semiconductor layer with a first photoresist layer;

patterning the first photoresist layer to expose the two end regions of the metal oxide semiconductor layer;

employing the patterned first photoresist layer as a mask to implement the ion implantation to the metal oxide semiconductor layer, and the two end regions of the metal oxide semiconductor layer after the ion implantation respectively are the source and the drain, and the region of the metal oxide semiconductor layer without the ion implantation is the active layer;

stripping the first photoresist layer.

* * * * *